(12) United States Patent
Li et al.

(10) Patent No.: US 12,052,868 B2
(45) Date of Patent: Jul. 30, 2024

(54) LADDER ANNEALING PROCESS FOR INCREASING POLYSILICON GRAIN SIZE IN SEMICONDUCTOR DEVICE

(71) Applicant: YANGTZE MEMORY TECHNOLOGIES CO., LTD., Wuhan (CN)

(72) Inventors: Tuo Li, Wuhan (CN); Hao Pu, Wuhan (CN); Lei Li, Wuhan (CN); Caiyu Wu, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 364 days.

(21) Appl. No.: 17/352,249

(22) Filed: Jun. 18, 2021

(65) Prior Publication Data
US 2022/0310643 A1     Sep. 29, 2022

Related U.S. Application Data

(63) Continuation of application No. PCT/CN2021/083492, filed on Mar. 29, 2021.

(51) Int. Cl.
*H10B 43/27* (2023.01)
*H01L 21/02* (2006.01)
(Continued)

(52) U.S. Cl.
CPC ....... *H10B 43/27* (2023.02); *H01L 21/02667* (2013.01); *H01L 21/67109* (2013.01); *H01L 29/04* (2013.01); *H10B 41/27* (2023.02)

(58) Field of Classification Search
CPC ... H10B 43/27; H10B 41/27; H01L 21/02667; H01L 21/02672; H01L 21/324
See application file for complete search history.

(56) References Cited

U.S. PATENT DOCUMENTS

| | | | |
|---|---|---|---|
| 5,385,863 A | 1/1995 | Tatsumi et al. | |
| 2002/0132452 A1* | 9/2002 | Oka | H01L 21/02516 257/E29.151 |

(Continued)

FOREIGN PATENT DOCUMENTS

| | | |
|---|---|---|
| CN | 1173241 A | 2/1998 |
| CN | 101154593 A | 4/2008 |

(Continued)

OTHER PUBLICATIONS

International Search Report issued in corresponding International Application No. PCT/CN2021/083492, mailed Dec. 30, 2021, 4 pages.

*Primary Examiner* — Alia Sabur
(74) *Attorney, Agent, or Firm* — BAYES PLLC

(57) ABSTRACT

Semiconductor fabrication methods and semiconductor devices are disclosed. According to some aspects, a memory device includes a memory stack having interleaved a plurality of conductive layers and a plurality of insulating layers on a substrate, and a channel structure extending vertically in the memory stack. The channel structure includes a semiconductor channel extending vertically in the memory stack and conductively connected to a source structure. The semiconductor channel includes polysilicon, and a grain size of the polysilicon ranges from 100 nm to 600 nm.

20 Claims, 10 Drawing Sheets

(51) Int. Cl.
*H01L 21/67* (2006.01)
*H01L 29/04* (2006.01)
*H10B 41/27* (2023.01)

(56) References Cited

U.S. PATENT DOCUMENTS

| | | | |
|---|---|---|---|
| 2005/0227459 A1* | 10/2005 | Takahashi | C23C 16/45557 257/E21.324 |
| 2015/0155369 A1* | 6/2015 | Zhang | H01L 29/66765 438/151 |
| 2016/0233227 A1 | 8/2016 | Zhang et al. | |
| 2016/0365353 A1* | 12/2016 | Aoyama | H01L 21/02532 |
| 2017/0330752 A1* | 11/2017 | Kim | H01L 21/30604 |
| 2018/0083028 A1* | 3/2018 | Fukumoto | H01L 21/02532 |
| 2019/0371810 A1* | 12/2019 | Saito | H01L 29/7926 |
| 2020/0161130 A1* | 5/2020 | Motoyama | H01L 21/0245 |
| 2021/0287998 A1* | 9/2021 | Isogai | H01L 21/324 |

FOREIGN PATENT DOCUMENTS

| | | |
|---|---|---|
| CN | 105226066 A | 1/2016 |
| CN | 108987408 A | 12/2018 |
| CN | 110867451 A | 3/2020 |
| CN | 111197179 A | 5/2020 |
| CN | 111386607 A | 7/2020 |
| GB | 2313477 A | 11/1997 |
| JP | 2009164321 A | 7/2009 |
| JP | 2018164082 A * | 10/2018 |
| KR | 20100041717 A * | 4/2010 |

* cited by examiner

LADDER ANNEALING PROCESS FOR INCREASING POLYSILICON GRAIN SIZE IN SEMICONDUCTOR DEVICE

CROSS-REFERENCE TO RELATED APPLICATIONS

This application is continuation of International Application No. PCT/CN2021/083492, filed on Mar. 29, 2021, entitled "LADDER ANNEALING PROCESS FOR INCREASING POLYSILICON GRAIN SIZE IN SEMICONDUCTOR DEVICE," which is hereby incorporated by reference in its entirety.

BACKGROUND

The present disclosure relates to semiconductor fabrication and semiconductor device formed thereof.

Planar semiconductor devices, such as memory cells, are scaled to smaller sizes by improving process technology, circuit design, programming algorithm, and fabrication process. However, as feature sizes of the semiconductor devices approach a lower limit, planar process and fabrication techniques become challenging and costly. A 3D semiconductor device architecture can address the density limitation in some planar semiconductor devices, for example, Flash memory devices.

A 3D semiconductor device can be formed by stacking semiconductor wafers or dies and interconnecting them vertically so that the resulting structure acts as a single device to achieve performance improvements at reduced power and a smaller footprint than conventional planar processes. Among the various techniques for stacking semiconductor substrates, bonding, such as hybrid bonding, is recognized as one of the promising techniques because of its capability of forming high-density interconnects.

SUMMARY

Structures and methods for forming semiconductor fabrication and semiconductor device formed thereof are disclosed herein.

In one aspect, a memory device includes a memory stack having interleaved a plurality of conductive layers and a plurality of insulating layers on a substrate, and a channel structure extending vertically in the memory stack. The channel structure includes a semiconductor channel extending vertically in the memory stack and conductively connected to a source structure. The semiconductor channel includes polysilicon, and a grain size of the polysilicon ranges from 100 nm to 600 nm.

In another aspect, a method for forming a channel structure in a memory device includes forming a stack structure having interleaved a plurality of first stack layers and a plurality of second stack layers over a substrate, forming a channel hole extending vertically in the stack structure, and depositing a semiconductor material layer over an inner surface of the channel hole. The semiconductor material layer includes an amorphous material. The method further includes converting the semiconductor material layer to a semiconductor layer. The semiconductor layer has a polycrystalline material. A conversion process includes a plurality of phases, and the phases include a first phase performed at a nucleation temperature of the amorphous material for a first period of time, and a second phase performed at a growth temperature of the polycrystalline material for a second period of time, the first and second periods of time each being greater than zero.

In still another aspect, a method for forming polycrystalline layer in a semiconductor device includes depositing an amorphous material on a surface, and converting the amorphous material to a polycrystalline material. A conversion process includes a plurality of phases, and the phases include a first phase performed at a nucleation temperature of the amorphous material for a first period of time, and a second phase performed at a growth temperature of the polycrystalline material for a second period of time, the first and second periods of time each being greater than zero.

In yet another aspect, a semiconductor manufacturing device includes a reaction chamber, a substrate holder located in the reaction chamber to hold a substrate, and a heater in the reaction chamber to control a plurality of process temperatures. The semiconductor manufacturing device also includes a gas source connected to the reaction chamber through a gasline, and the gas source has at least hydrogen gas. The reaction chamber and the heater are configured to perform a thermal treatment on the substrate to convert an amorphous material to a polycrystalline material. The plurality of process temperatures include a first temperature at a nucleation temperature of the amorphous material and a second temperature at a growth temperature of the polycrystalline material.

BRIEF DESCRIPTION OF THE DRAWINGS

The accompanying drawings, which are incorporated herein and form a part of the specification, illustrate aspects of the present disclosure and, together with the description, further serve to explain the present disclosure and to enable a person skilled in the pertinent art to make and use the present disclosure.

Figure 1:
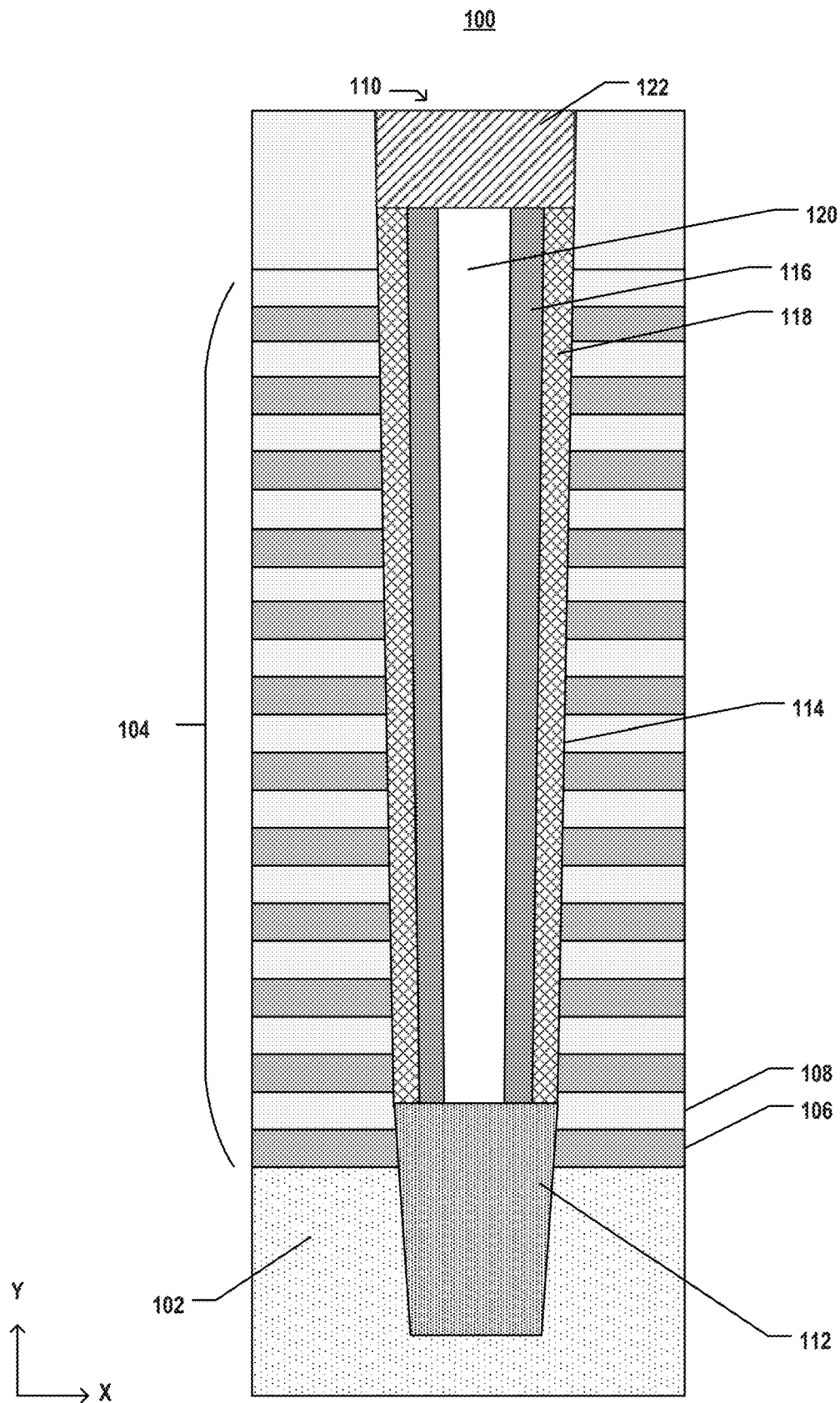
FIG. 1 illustrates a cross-section of an exemplary 3D memory device, according to some aspects of the present disclosure.

The present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

As used herein, the term "at a temperature" refers to being in a reasonable vicinity of a specific temperature. For example, "at temperature X" refers to being in ±5%, ±10%, or ±15% of temperature X.

3D memory devices include memory cells formed by the intersections of gate conductive layers and memory strings. In 3D memory devices, electrons and holes are transported in semiconductor channels between the drain and the source of a memory string for the operation, e.g., read, program, and erase, of the 3D memory device. The semiconductor channel often includes a layer of semiconductor material, such as polysilicon, which becomes conductive when biased. The performance/functioning of the semiconductor channel is often impacted by the crystalline properties and quality of the semiconductor material. For example, the thickness uniformity and the grain size of the semiconductor channel can have an impact on carrier mobility. As the stacks of the 3D memory devices become higher because of the demand for higher storage capacity, semiconductor channels are formed in channel holes having greater depths. It can be more difficult to form a semiconductor channel with desirably uniform thickness and grain size using current techniques.

The current fabrication process to form the semiconductor channel includes the deposition of a layer of amorphous silicon in the channel hole, and converting the layer of amorphous silicon to a layer of polycrystalline silicon, i.e., polysilicon. The conversion process often includes an annealing process in which the chamber temperature is increased to a temperature higher than the nucleation temperature of the amorphous silicon, and maintained at the temperature for a period of time. That is, the chamber temperature is maintained constant above the nucleation temperature of the amorphous silicon during the annealing process. Under the same chamber temperature, the amorphous silicon can nucleate, and the nuclei can grow to form a polycrystalline material, which is the polysilicon. Because the nucleation and growth take place under the same temperature, the two processes may interfere with each other. Consequentially, the polysilicon formed by this process often has a grain size ranging from 100 nm to 300 nm. Because grain size is often proportionally associated with electron mobility, e.g., a greater grain size results in a higher carrier mobility, and vice versa, the grain size formed from the current annealing process can only result in a device speed that can satisfy 3D memory devices with few levels (e.g., 128 levels or below). However, for 3D memory devices of increased heights, e.g., 3D memory devices of 192 or more levels, the current grain size is too small to provide a desirable carrier mobility/device speed. To increase the carrier mobility of 3D memory devices of increased levels, the grain size of the semiconductor channel needs to be increased.

Various implementations in accordance with the present disclosure provide structures and methods for forming 3D memory devices having a semiconductor channel with increased grain size. In an example, the grain size of the semiconductor channel ranges from 100 nm to 600 nm. A "ladder annealing process" can be used to modulate the chamber/annealing temperature to form the semiconductor channel with the increased grain size. The ladder annealing process has a plurality of phases, which includes at least a first phase at the nucleation temperature of the amorphous silicon for a respective period of time, and a second phase at a growth temperature of the polysilicon for a respective period of time. The second phase is performed after the first phase, and the growth temperature is higher than the nucleation temperature. In the first phase, the chamber temperature is maintained at the nucleation temperature to allow the nuclei to form and stabilize. In the second phase, the chamber temperature is maintained at a growth temperature to allow the nuclei to grow at a desirably high speed. Compared with the current annealing process, in which the same temperature higher than the nucleation temperature is maintained for both nucleation and growth, the provided method employs at least two phases to separate the nucleation process and the growth process. The nucleation and growth can each be more efficient, allowing increased grain size to be formed. In some implementations, depending on the fabrication process, one or more phases can be performed before the first phase and/or after the second phase to optimize the film quality and maximize grain size. In some implementations, phases with temperatures higher than those in the current fabrication method are employed in the annealing process, and the total annealing time needed for the crystallization can be reduced. Production costs can be reduced accordingly.

FIG. 1 illustrates a cross-section of an exemplary 3D memory device 100, according to some aspects of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some implementations, substrate 102 is a thinned substrate (e.g., a semiconductor layer), which was thinned by grinding, etching, chemical mechanical polishing (CMP), or any combination thereof. It is noted that x and y axes are included in FIG. 1 to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 202) in the y-direction (i.e., the vertical direction) when the substrate is positioned in the lowest plane of the 3D memory device in the y-direction. The same notion for describing spatial relationships is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some implementations, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some implementations, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some implementations, 3D memory device 100 is a NAND Flash memory device in which memory cells are provided in the form of an array of NAND memory strings 110 each extending vertically above substrate 102. The memory array device can include NAND memory strings 110 that extend through a plurality of pairs each including a conductive layer 106 and a dielectric layer 108 (referred to herein as "conductive/dielectric layer pairs"). The stacked conductive/dielectric layer pairs are also referred to herein as a "memory stack" 104. In some implementations, a pad oxide layer (not shown) is formed between substrate 102 and memory stack 104. The number of the conductive/dielectric layer pairs in memory stack 104 determines the number of memory cells in 3D memory device 100. Memory stack 104 can include interleaved conductive layers 106 and dielectric layers 108. Conductive layers 106 and dielectric layers 108 in memory stack 104 can alternate in the vertical direction. Conductive layers 106 can include conductive materials including, but not limited to, tungsten (W), cobalt (Co), copper (Cu), aluminum (Al), polysilicon, doped silicon, silicides, or any combination thereof. Dielectric layers 108 can include dielectric materials including, but not limited to, silicon oxide, silicon nitride, silicon oxynitride, or any combination thereof.

As shown in FIG. 1, NAND memory string 110 can include a channel structure 114 extending vertically through memory stack 104. Channel structure 114 can include a channel hole filled with semiconductor materials (e.g., as a semiconductor channel 116) and dielectric materials (e.g., as a memory film 118). In some implementations, memory film 118 is a composite layer including a tunneling layer, a storage layer (also known as a "charge trap layer"), and a blocking layer. The remaining space of channel structure 114 can be partially or fully filled with a filling layer 120 including dielectric materials, such as silicon oxide. Channel structure 114 can have a cylinder shape (e.g., a pillar shape). Filling layer 120, semiconductor channel 116, the tunneling layer, the storage layer, and the blocking layer are arranged radially from the center toward the outer surface of the pillar in this order, according to some implementations. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof. In one example, memory film 118 can include a composite layer of silicon oxide/silicon oxynitride (or silicon nitride)/silicon oxide (ONO).

Semiconductor channel 116 may include a layer of semiconductor layer, which becomes conductive when biased. Electrons and holes can be transported vertically in semiconductor channel 116. In some implementations, semiconductor channel 116 includes undoped polycrystalline silicon, i.e., undoped polysilicon. The grain size of the undoped polysilicon can range from 100 nm to 600 nm (e.g., 100 nm, 150 nm, 200 nm, 250 nm, 300 nm, 350 nm, 400 nm, 450 nm, 500 nm, 550 nm, 600 nm, or any other suitable values). In some implementations, the grain size of the undoped polysilicon can reach up to 800 nm (e.g., 650 nm, 700 nm, 750 nm, 800 nm, or any other suitable values). The increased grain size of the undoped polysilicon, compared to the semiconductor channel formed by the current fabrication process, can effectively increase the carrier mobility, and thus the device speed, of 3D memory device 100, providing desirable device speed for 3D memory devices with increased levels (e.g., conductive/dielectric layer pairs).

In some implementations, semiconductor channel 116 includes an inner layer and an outer layer (not shown) in contact with the inner layer. The inner layer and the outer layer may each include undoped polysilicon. The inner layer may be closer to the center of channel structure 114 while the outer layer may be further away from the center of channel structure 114. The inner layer may have a first grain size, and the outer layer may have a second grain size. The first grain size may be smaller than the second grain size. In some implementations, the first grain size ranges from 100 nm to 500 nm (e.g., 100 nm, 150 nm, 200 nm, 250 nm, 300 nm, 350 nm, 400 nm, 450 nm, 500 nm, or any other suitable values). In some implementations, the second grain size ranges from 300 nm to 800 nm (e.g., 300 nm, 350 nm, 400 nm, 450 nm, 500 nm, 550 nm, 600 nm, 650 nm, 700 nm, 750 nm, 800 nm, or any other suitable values).

In some implementations, conductive layer 106 (each being part of a word line) in memory stack 104 functions as a gate conductor of memory cells in NAND memory string 110. Conductive layer 106 can include multiple control gates of multiple NAND memory cells and can extend laterally as a word line ending at the edge of memory stack 104 (e.g., in a staircase structure of memory stack 104). In some implementations, memory cell transistors in NAND memory string 110 include gate conductors (i.e., parts of conductive layers 106 that abut channel structure 114) made from tungsten, adhesion layers (not shown) including titanium/titanium nitride (Ti/TiN) or tantalum/tantalum nitride (Ta/TaN), gate dielectric layers (not shown) made from high-k dielectric materials, and channel structure 214 including polysilicon.

In some implementations, NAND memory string 110 further includes a semiconductor plug 112 in a lower portion (e.g., at the lower end) of NAND memory string 110 below channel structure 114. As used herein, the "upper end" of a component (e.g., NAND memory string 110) is the end farther away from substrate 102 in they-direction, and the "lower end" of the component (e.g., NAND memory string 110) is the end closer to substrate 102 in they-direction when substrate 102 is positioned in the lowest plane of 3D memory device 100. Semiconductor plug 112 can include a semiconductor material, such as silicon, which is epitaxially grown from substrate 102 in any suitable directions. It is understood that in some implementations, semiconductor plug 112 includes single crystalline silicon, the same material as substrate 102. In other words, semiconductor plug 112 can include an epitaxially-grown semiconductor layer that is the same as the material of substrate 102. In some implementations, semiconductor plug 112 can be deposited. In some implementations, part of semiconductor plug 112 is above the top surface of substrate 102 and in contact with semiconductor channel 116. Semiconductor plug 112 can function as a channel controlled by a source select gate of NAND memory string 110, and is conductively connected to the source structure of NAND memory string 110. It is understood that in some implementations, 3D memory device 100 does not include semiconductor plug 112.

In some implementations, NAND memory string 110 further includes a channel plug 122 in an upper portion (e.g., at the upper end) of NAND memory string 110. Channel plug 122 can be in contact with the upper end of semiconductor channel 116. Channel plug 122 can include semiconductor materials (e.g., polysilicon). By covering the upper end of channel structure 114 during the fabrication of 3D memory device 100, channel plug 122 can function as an etch stop layer to prevent etching of dielectrics filled in channel structure 114, such as silicon oxide and silicon nitride. In some implementations, channel plug 122 also functions as the drain of NAND memory string 110. It is understood that in some implementations, 3D memory device 100 does not include channel plug 122.

Figure 2A:
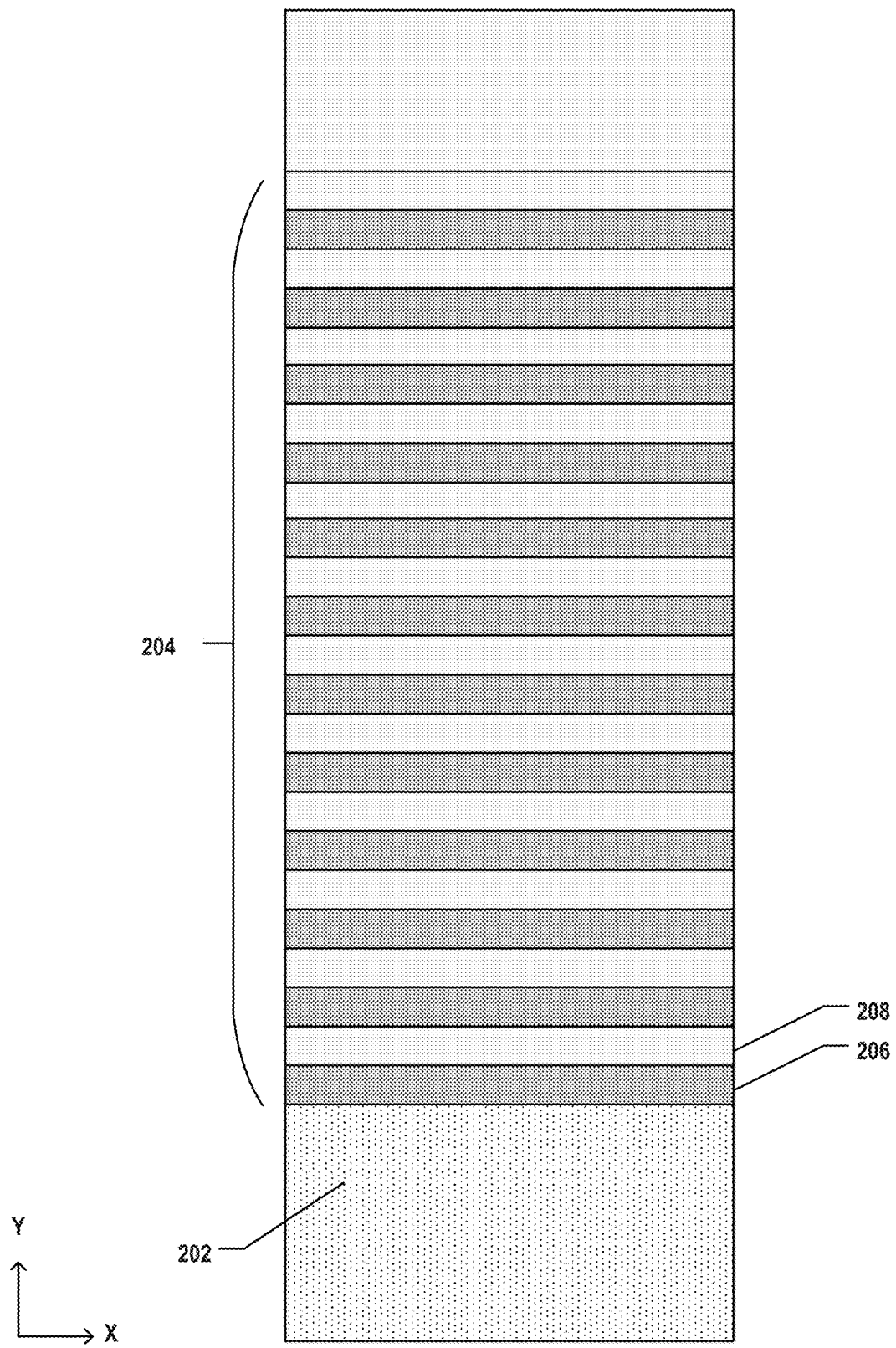
FIGS. 2A-2D illustrate cross-sections of an exemplary 3D memory device at different stages of a manufacturing process, according to some aspects of the present disclosure.
Figure 2B:
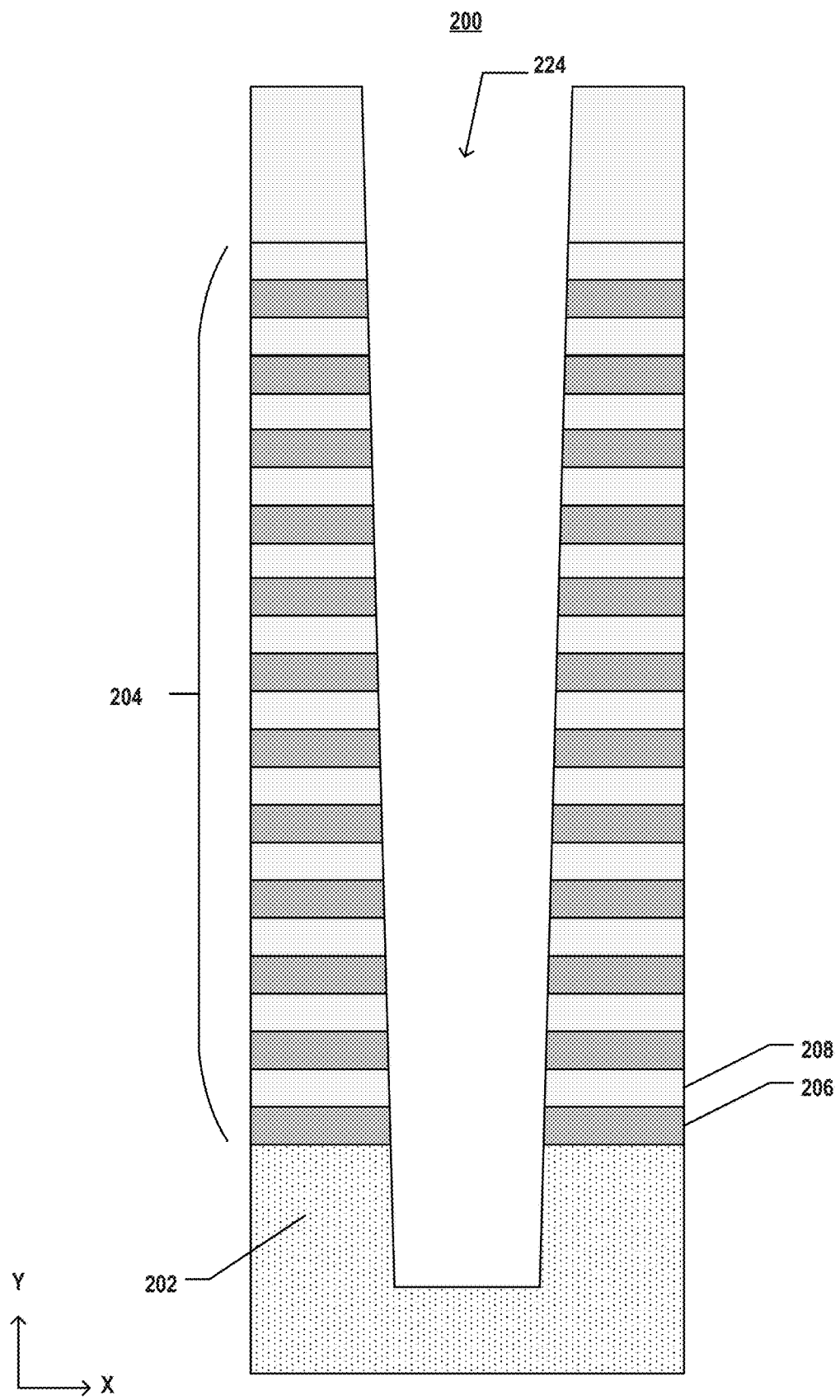
Figure 2C:
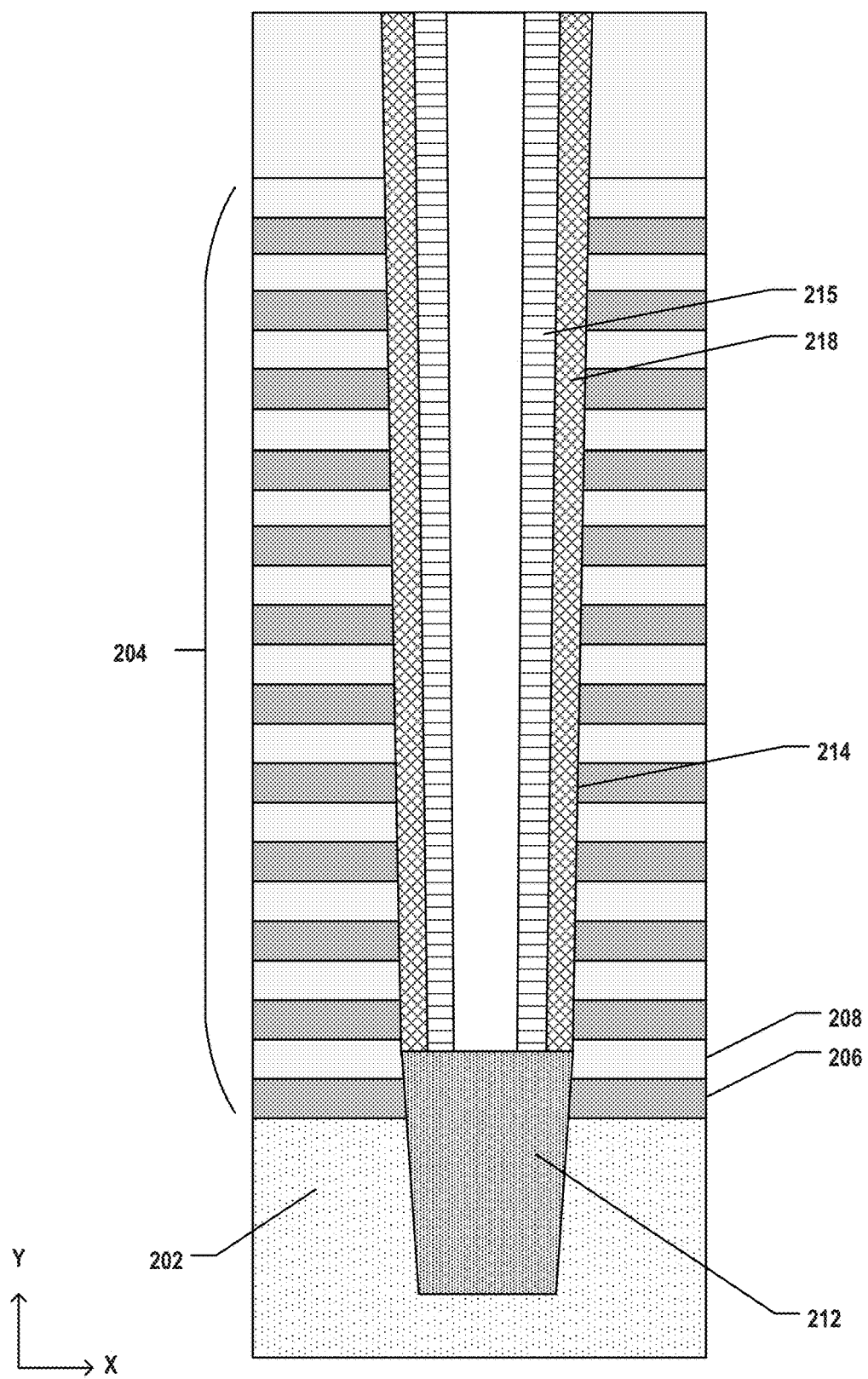
Figure 2D:
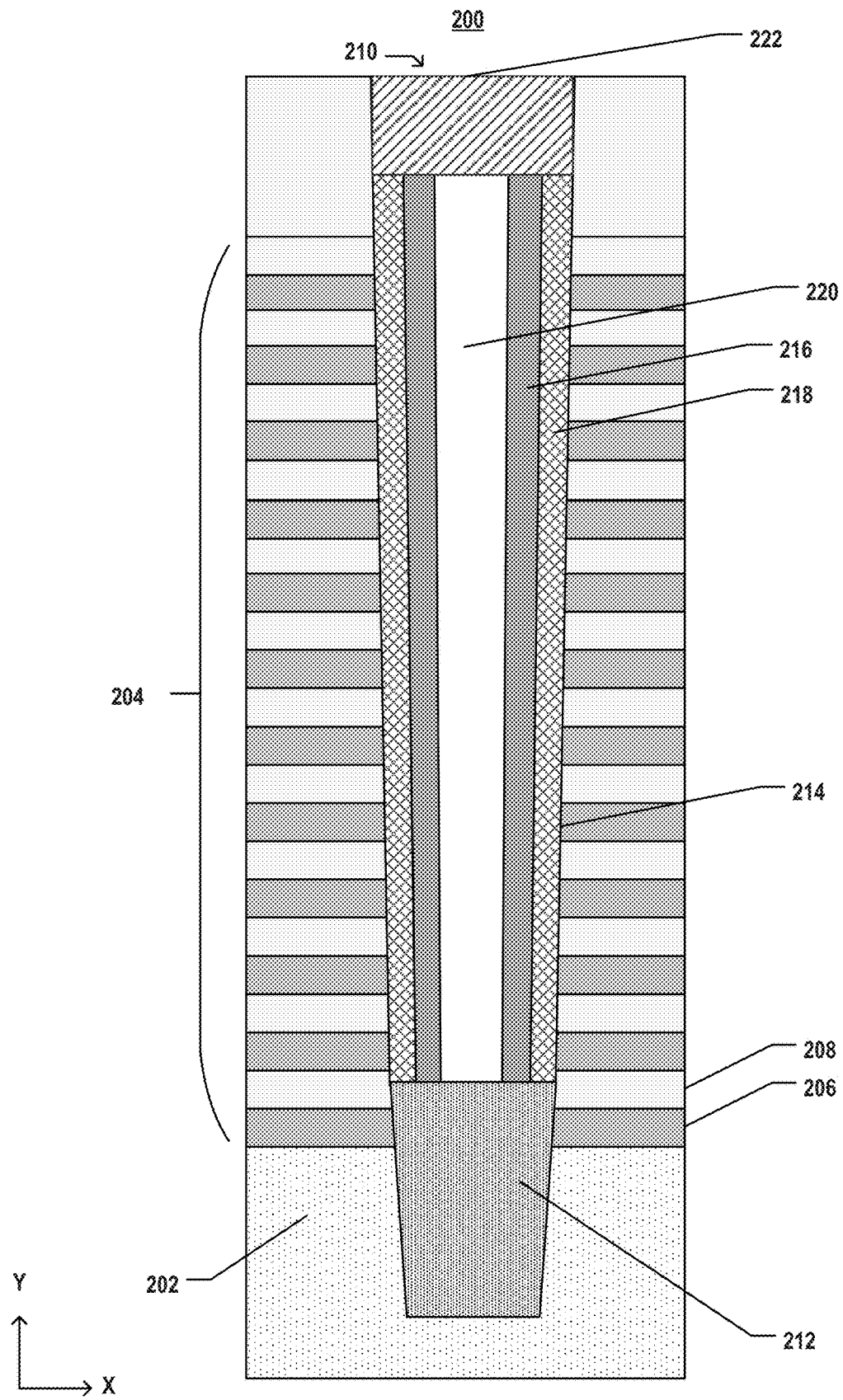
Figure 3:
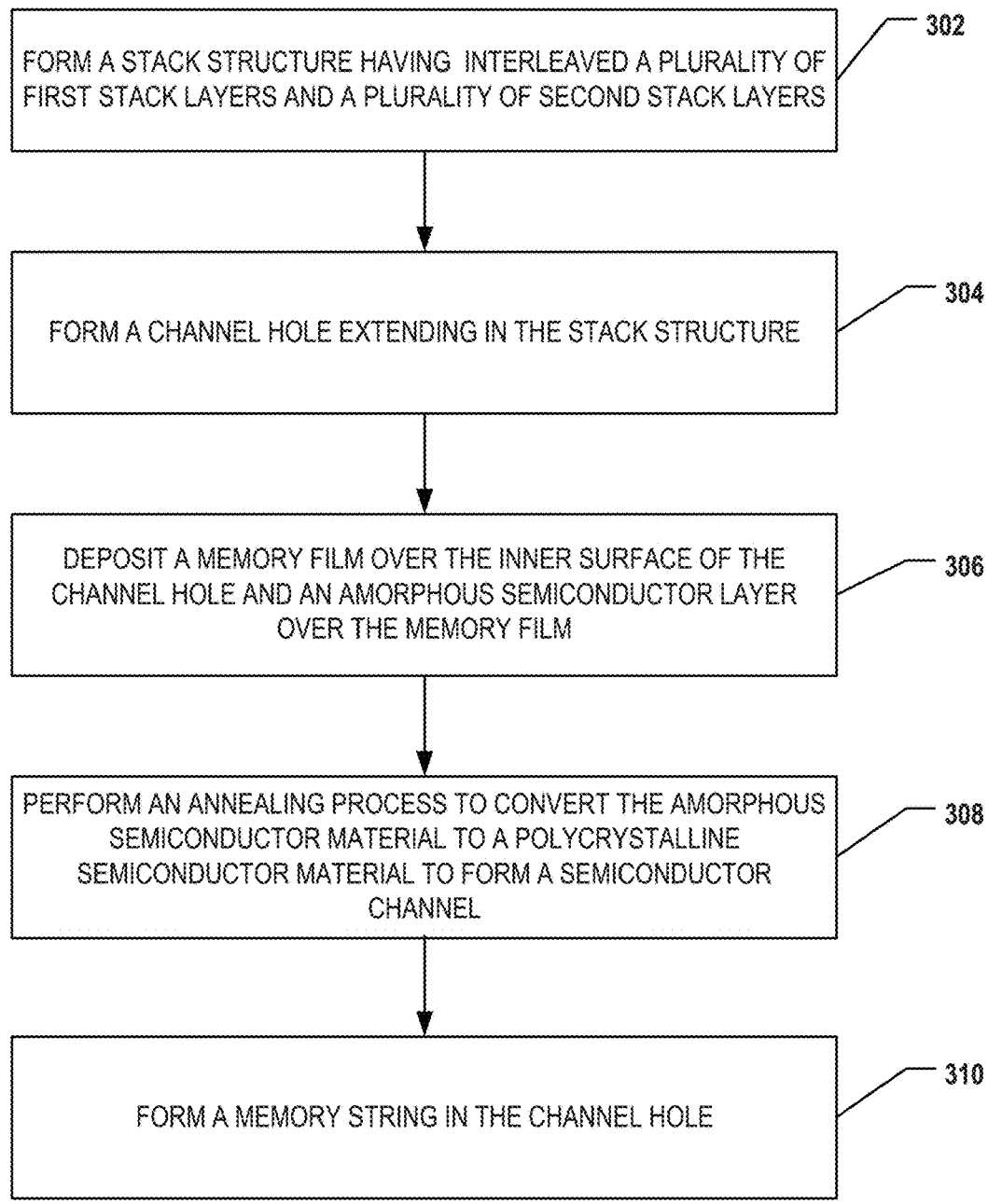
FIG. 3 illustrates a flowchart of an exemplary method for forming a 3D memory device, according to some aspects of the present disclosure.
Figure 4:
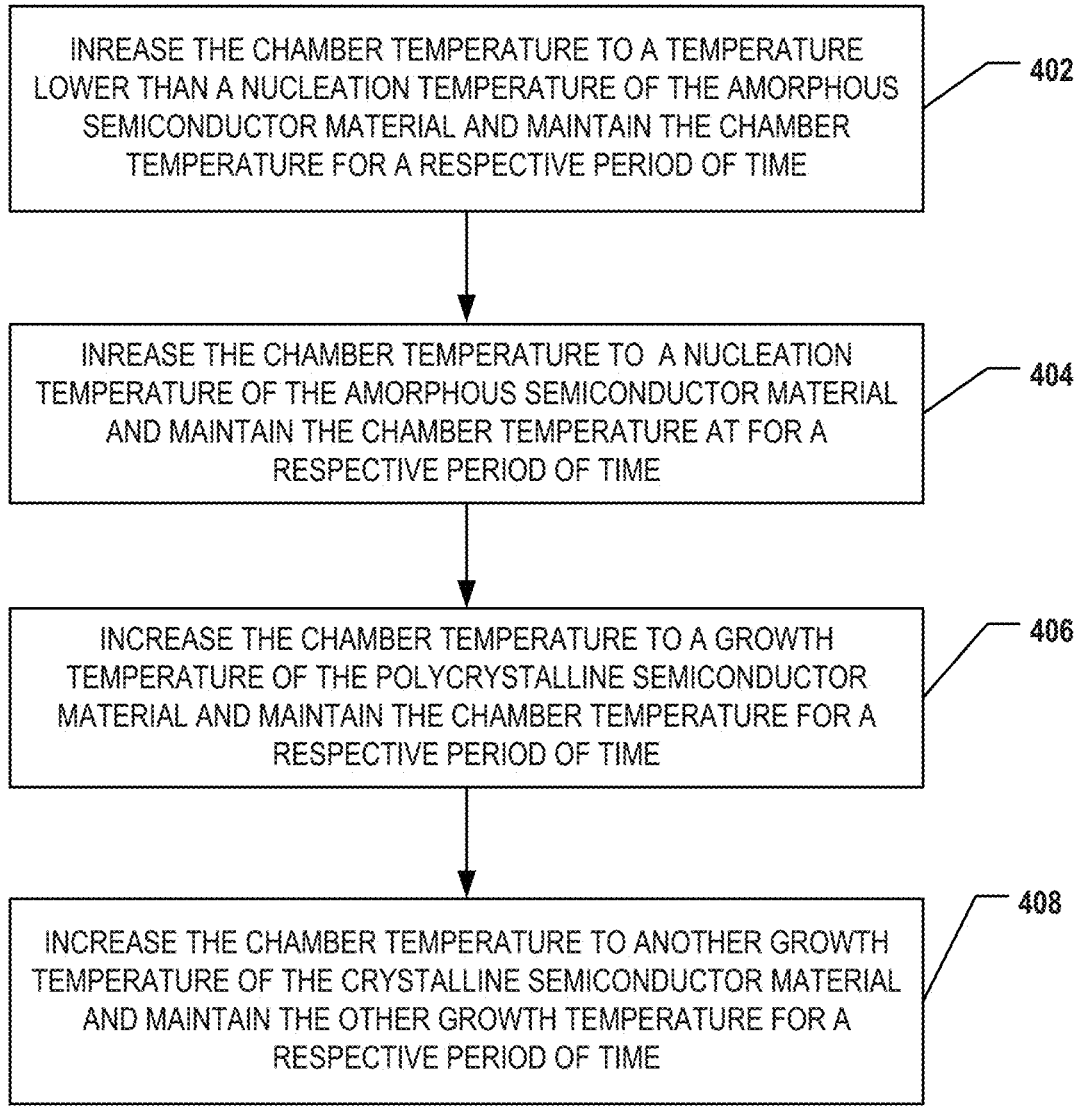
FIG. 4 illustrates a flowchart of an exemplary method for an annealing process, according to some aspects of the present disclosure.
Figure 5:
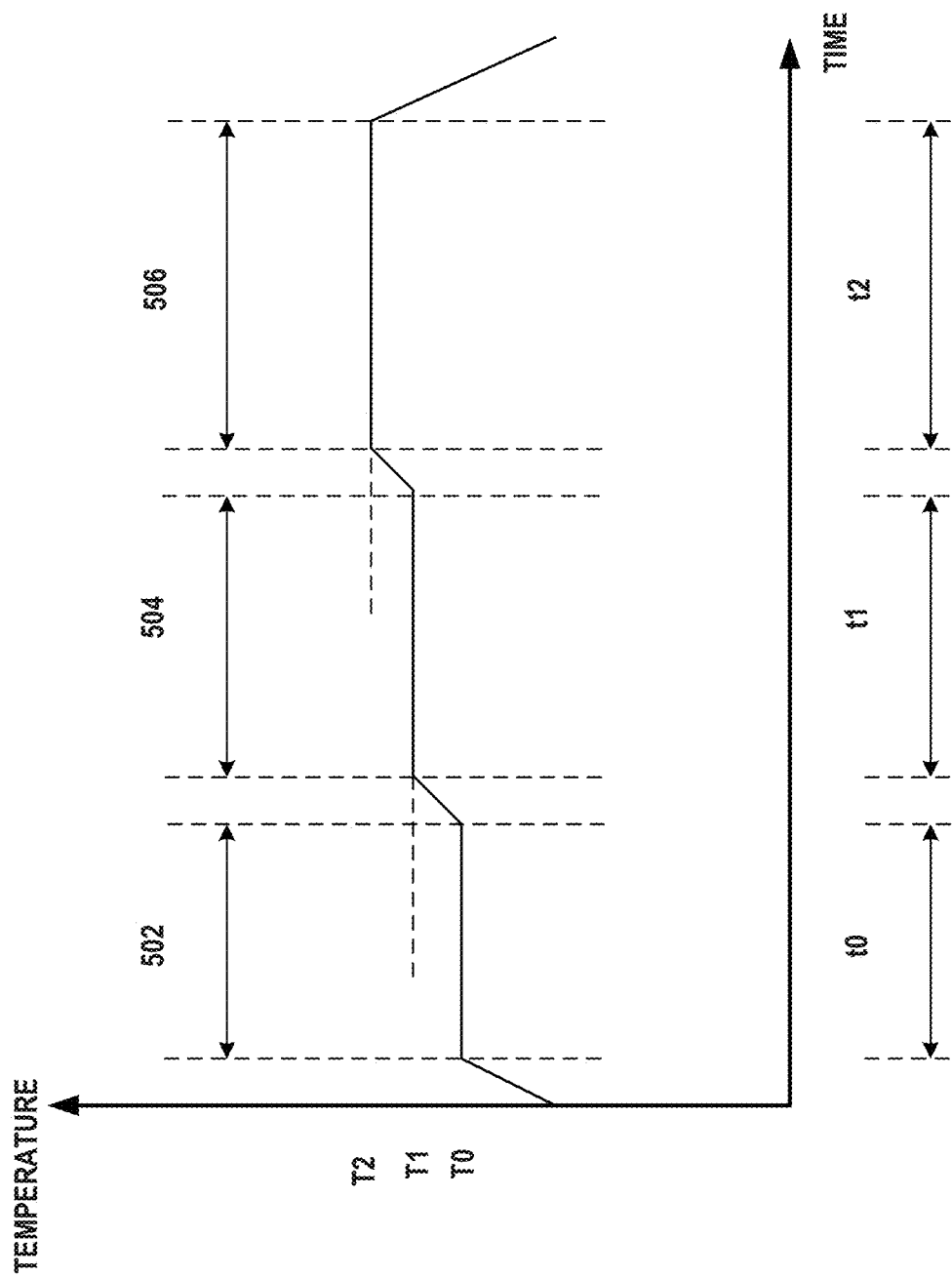
FIG. 5 illustrates chamber temperature as a function of time in an annealing process, according to some aspects of the present disclosure.

FIGS. 2A-2D illustrate cross-sections of an exemplary 3D memory device 200 at different stages of a manufacturing process, according to some aspects of the present disclosure. 3D memory device 200 may be an example of 3D memory device 100. FIG. 3 illustrates a flowchart of an exemplary method 300 for forming 3D memory device 200, according to some aspects of the present disclosure. FIG. 4 illustrates a flowchart of an exemplary method 400 for performing an annealing process in method 300, according to some aspects of the present disclosure. FIG. 5 illustrates different phases in the annealing process, according to some implementations. For the purpose of better explaining the present disclosure, FIGS. 2A-2D, 3, 4, and 5 will be described together. It is understood that the operations shown in methods 300 and 400 are not exhaustive and that other operations can be performed as well before, after, or between any of the illustrated operations. Further, some of the operations may be performed simultaneously, or in a different order than shown in FIGS. 2A-2D, 3, 4, and 5.

As shown in FIG. 3, method 300 starts from operation 302, in which a stack structure having interleaved a plurality of first stack layers and a plurality of second stack layers are formed on a substrate. FIG. 2A illustrates a corresponding structure.

As shown in FIG. 2A, a stack structure 204 is formed on a substrate 202. Stack structure 204 includes a plurality of interleaved first stack layers 208 and second stack layers 206. Substrate 202 may be a silicon substrate, and first stack layers 208 and second stack layers 206 may be alternatively deposited on substrate 202 to form stack structure 204. In some implementations, stack structure 204 is a dielectric stack, each first stack layer 208 is a first dielectric layer, and each second stack layer 206 is a second dielectric layer different from the first dielectric layer (a.k.a. sacrificial layer). In some implementations, each first stack layer 208 may include a layer of silicon oxide, and each second stack layer 206 may include a layer of silicon nitride. Stack structure 204 may be formed by one or more thin film deposition processes including, but not limited to, chemical vapor deposition (CVD), physical vapor deposition (PVD), atomic layer deposition (ALD), or any combination thereof. In some implementations, a pad oxide layer (not shown) is formed between substrate 202 and stack structure 204 by depositing dielectric materials, such as silicon oxide, on substrate 202. In some implementations, each first stack layer 208 is a dielectric layer, such as a silicon oxide layer or silicon nitride layer; and each second stack layer 206 is a conductive layer, such as a doped polysilicon layer.

Referring back to FIG. 3, method 300 proceeds to operation 304, in which a channel hole is formed extending in the stack structure. FIG. 2B illustrates a corresponding structure.

As shown in FIG. 2B, an opening 224 is formed in stack structure 204. Opening 224 extends vertically through the interleaved first stack layers 208 and second stack layers 206. Opening 224 is etched through interleaved first stack layers 208 and second stack layers 206 and forms a channel hole for a channel structure of 3D memory device 200. In some implementations, a plurality of openings are formed through stack structure 204 such that each opening becomes the location for growing an individual NAND memory string in the latter process. In some implementations, fabrication processes for forming opening 224 may include wet etching and/or dry etching, such as DRIE. In some implementations, opening 224 may extend further into the top portion of substrate 202. In some implementations, opening 224 may be in contact with a doping region in substrate 202 that is conductively connected to the source structure of 3D memory device 200.

Referring back to FIG. 3, method 300 proceeds to operation 306, in which a memory film is deposited over the inner surface of the channel hole, and an amorphous semiconductor layer is deposited over the memory film. FIG. 2C illustrates a corresponding structure.

As shown in FIG. 2C, a memory film 218 is deposited over the inner surface of opening 224 (e.g., the channel hole), and a layer of an amorphous semiconductor layer 215 is deposited over memory film 218. The amorphous semiconductor layer 215 may include a layer of amorphous semiconductor material that can be converted to a polycrystalline material, which can function as the semiconductor channel of 3D memory device 200. In some implementations, memory film 218 includes a blocking layer on the inner surface of opening 224, a storage layer on the block layer, and a tunneling layer on the storage layer. The deposition of memory film 218 and amorphous semiconductor layer 215 may include CVD, PVD, and/or ALD. In some implementations, amorphous semiconductor layer 215 includes amorphous silicon and is deposited at a low temperature, e.g., between 450 and 500 degrees Celsius. In some implementations, the amorphous silicon is deposited at 470 degrees Celsius. Optionally, a semiconductor plug 212 is formed by epitaxial growth or deposition (e.g., CVD, PVD, and/or ALD) prior to the deposition of memory film 218 and amorphous semiconductor layer 215.

Referring back to FIG. 3, method 300 proceeds to operation 308, in which an annealing process is performed to convert the amorphous semiconductor material to a polycrystalline semiconductor material to form a semiconductor channel. FIG. 2D illustrates a corresponding structure.

As shown in FIG. 2D, a semiconductor channel 216 may be formed by converting amorphous semiconductor layer 215 to a layer of polycrystalline semiconductor material. A thermal treatment, e.g., a "ladder annealing process" is used for the conversion process. The ladder annealing may include a plurality of phases, each at a respective temperature for a respective period of time. FIG. 4 illustrates method 400 used for the annealing process in operation 308, and FIG. 5 illustrates the plurality of phases used in the annealing process, according to some implementations. In some implementations, a suitable gas, e.g., hydrogen gas, is used in the thermal treatment, e.g., to remove defects during the annealing process.

Referring to FIG. 4, method 400 starts at operation 404, in which the chamber temperature is increased to a nucleation temperature of the amorphous semiconductor material and is maintained at the nucleation temperature for a respective period of time. FIG. 5 shows a corresponding phase 504. In some implementations, the chamber temperature is increased, e.g., from the deposition temperature of the amorphous semiconductor material to a nucleation temperature T1 of the amorphous semiconductor material in phase 504. For example, the amorphous semiconductor material may include amorphous silicon, and nucleation temperature T1 is around 600 degrees Celsius. In some implementations, nucleation temperature T1 of a specific material includes a range with a lower end and a higher end, and a specific value is chosen from the range to be used as the nucleation temperature in this operation. The chamber temperature may be maintained at nucleation temperature T1 in phase 504 for a suitable period of time, allowing the nuclei to form and stabilize. In some implementations, for amorphous silicon, a time period t1 of phase 504 may be a few hours, such as 2-3 hours.

Method 400 proceeds to operation 406, in which the chamber temperature is increased to a growth temperature T2 of the polycrystalline semiconductor material and is maintained at growth temperature T2 for a respective period of time. FIG. 5 shows a corresponding phase 506 taken place after phase 504. In some implementations, the chamber temperature is increased, e.g., from nucleation temperature T1 to growth temperature T2 of polycrystalline semiconductor material in phase 506. In some implementations, a higher growth temperature can result in a higher growth speed of the nuclei. Growth temperature T2 may represent a suitable one, e.g., a low end, of the plurality of growth temperatures at which free particles (e.g., atoms) start to adsorb onto the nuclei and propagate the crystalline structure outwards from the nucleating sites. In some implementations, a relatively low growth temperature is chosen for phase 504 to facilitate a slow growth rate and more uniform film and desirable quality. The chamber temperature may be maintained at growth temperature T2 in phase 506 for a suitable period of time, allowing the nuclei of polysilicon to grow. In some implementations, the polycrystalline semiconductor material includes polysilicon, and growth temperature T2 can range from 600 degree Celsius to 750 degree Celsius (e.g., 600, 630, 650, 680, 700, 730, 750 degrees Celsius). In some implementations, T2 is chosen to be 650 degrees Celsius. In some implementations, for polysilicon, a time period t2 of phase 506 may be a few hours, such as 2-3 hours.

In various implementations, the thermal treatment includes at least phase 504 and phase 506, in which the chamber conditions for the nucleation and growth are set to be separate, minimizing the interference between nucleation and growth during the crystallization process. Each of the nucleation and growth can be optimized at respective temperature(s). The grain size of the polycrystalline semiconductor material can be increased. In some implementations, additional phases can be added to the thermal treatment to further optimize the structure of the polycrystalline semiconductor material. Optionally, as shown in FIG. 4, method 400 includes operation 402, in which the chamber temperature is increased to a temperature lower than the nucleation temperature of the amorphous semiconductor material and is maintained for a respective period of time.

As shown in FIG. 5, a phase 502 is added prior to phase 504. In some implementations, the chamber temperature is increased, e.g., from the deposition temperature of the amorphous semiconductor material to a temperature T0 lower than nucleation temperature T1, and is maintained at T0 for a respective period of time. T0 may be slightly lower than nucleation temperature T1. In some implementations, T0 is below any nucleation temperature of the amorphous semiconductor material. In some other implementations, T0 is another nucleation temperature of the amorphous semiconductor material lower than T1. In some implementations, the critical condition for nucleation can occur between T0 and T1. For example, a difference between T1 and T0 can be between 3% to 3.5% of nucleation temperature T1. In some implementations, for amorphous silicon, nucleation temperature is 600 degrees Celsius, and T0 is 580 degrees Celsius. In some implementations, both T0 and T1 are included in the range of the nucleation temperature of the amorphous semiconductor material. For example, amorphous silicon can nucleate at any temperature between 580 degrees Celsius and 600 degrees Celsius. The selection of more than one phase at the nucleation temperature and/or slightly lower than the nucleation temperature can optimize the nucleation condition for the amorphous semiconductor material, allowing nuclei to form and stabilize more efficiently. In some implementations, the chamber temperature is maintained at temperature T0 in phase 502 for a suitable period of time, allowing the nuclei to start to form. In some implementations, for polysilicon, a time period t0 of phase 502 may be a few hours, such as 2-3 hours.

Optionally, as shown in FIG. 4, method 400 proceeds to operation 408, in which another phase may be added after phase 506, and the chamber temperature can be increased to another growth temperature and is maintained for a respective period of time in the phase. The other growth temperature can be higher than T2. For example, the chamber temperature can be increased from growth temperature T2 to another growth temperature T3, and is maintained at T3 for a respective period of time. For example, for polysilicon, T3 can be any suitable temperature between 650 degrees Celsius to 750 degrees Celsius, e.g., 680, 700, 730, 750 degrees Celsius. In some implementations, for polysilicon, a time period t3 of the phase may be a few hours, such as 2-3 hours. In some implementations, the phase is at a relatively high growth temperature, e.g., 750 degrees Celsius, increasing the growth rate of the nuclei. In some implementations, a lower growth temperature (e.g., T2) can be omitted, and the chamber temperature can be increased to a relatively high temperature, e.g., 750 degrees Celsius immediately from nucleation temperature T1. It should be noted that the numbers of phases at/around the nucleation and growth should be determined based on the film quality and crystalline properties of the polycrystalline semiconductor material and should not be limited by the implementations of the present disclosure. Although not shown in the figures, in some implementations, more than one phase at higher growth temperatures can be added after phase 506, and/or more than one phase at temperatures lower than nucleation temperature T1 can be added prior to phase 504.

In some implementations, the total thermal energy provided in all the phases may be sufficient for the amorphous semiconductor material to convert to the polycrystalline semiconductor material. The total thermal energy can be proportionally associated with the chamber temperature and the lengths of the time periods. Thus, the total time of the thermal treatment can be adjusted based on the chamber temperatures and the lengths of the phases. In some implementations, the total time of the thermal treatment is shorter than that of the current fabrication process. After the thermal treatment, the amorphous semiconductor material (e.g., amorphous silicon) may be converted to the polycrystalline semiconductor material (e.g., polysilicon), and a semiconductor channel 216 may be formed.

In some implementations, more than one layers of polycrystalline semiconductor material can be formed in semiconductor channel 216. For example, after the layer of polycrystalline semiconductor material (e.g., an outer layer) is formed in operation 308, a second layer of the amorphous semiconductor material can be deposited over the layer of polycrystalline semiconductor material. A second thermal treatment, e.g., a second annealing process, may be performed on the second layer of amorphous semiconductor material using method 400, to form a second layer of polycrystalline semiconductor material (e.g., an inner layer). In some embodiments, when the second layer of the amorphous semiconductor material is undergoing the second thermal treatment, the layer of polycrystalline semiconductor material also undergoes the second thermal treatment. The second thermal treatment may further increase the grain size of the layer of polycrystalline semiconductor material. In some implementations, the layer of polycrystalline semiconductor material has a greater grain size than the second layer of polycrystalline semiconductor material.

Referring back to FIG. 3, method 300 proceeds to operation 310, in which a memory string is formed in the channel hole. FIG. 2D illustrates a corresponding structure. As shown in FIG. 2D, after the thermal treatment, a NAND memory string 210 is formed in opening 224. NAND memory string 210 extends vertically through stack structure 204 above substrate 202 and may include a channel structure 214 extending vertically through stack structure 204. Channel structure 214 may include a semiconductor channel 216, a memory film 218, a capping layer 220, and a channel plug 222. Capping layer 220 may be deposited over semiconductor channel 216 to fully or partially fill the space in opening 224. Channel plug 222 may then be formed in the upper portion of NAND memory string 210. Semiconductor channel 216 may be in contact with channel plug 222 and semiconductor plug 212 in a lower portion of NAND memory string 210. Channel structure 214 may have a cylinder shape (e.g., a pillar shape). In some implementations, the formation of capping layer 220 includes CVD, PVD, and/or ALD. In some implementations, the formation of channel plug 222 includes CVD, PVD, ALD, electroplate, and/or bonding.

It is understood that, in FIGS. 2A-2D, stack structure 204 including first stack layer 208 and second stack layer 206 is used as examples to explain the present disclosure, and first stack layer 208 and second stack layer 206 may have different structure or operation according to different process procedure. In some implementations, stack structure 204 is a dielectric stack, each first stack layer 208 is a first dielectric layer, and each second stack layer 206 is a second dielectric layer different from the first dielectric layer (a.k.a. sacrificial layer). The sacrificial layers could be removed and be replaced with conductive layers (e.g., W, Al, Co, Cu) in the consequential processes to form the gate layers (word lines of the 3D NAND memory device). In some implementations, each first stack layer 208 is a dielectric layer, and each second stack layer 206 is a conductive layer (e.g., polysilicon). The conductive layers could be the gate layers of the 3D NAND memory device, and the gate replacement process is not required.

Figure 6A:
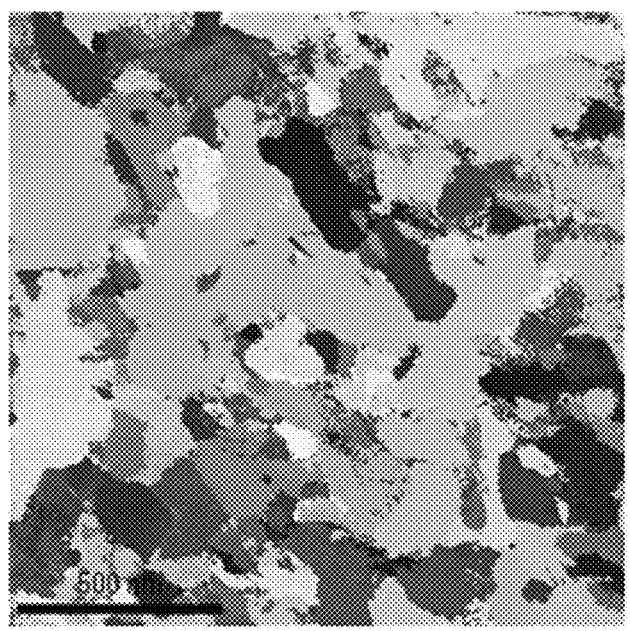
FIG. 6A illustrates an electron microscope image showing a grain size of a semiconductor channel formed by an annealing process, according to some aspects of the present disclosure.
Figure 6B:
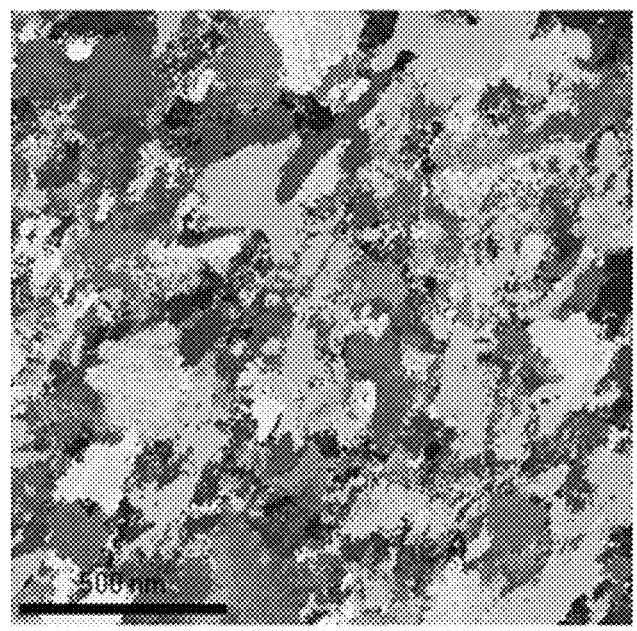
FIG. 6B illustrates an electron microscope image showing a grain size of a semiconductor channel formed by an annealing process.

FIG. 6A illustrates an electron microscope image showing a cross-section of a semiconductor channel in an exemplary 3D semiconductor device after the thermal treatment, according to some aspects of the present disclosure. FIG. 6B illustrates an electron microscope image showing a cross-section of a semiconductor channel in a 3D semiconductor device after a current annealing process, in which the annealing process is performed at a single temperature higher than the nucleation temperature of the amorphous semiconductor material. The semiconductor channel may include undoped polysilicon, formed by methods 300 and 400, as described. As shown in FIGS. 6A and 6B, the thermal treatment can form undoped polysilicon with increased grain size, which facilitates higher carrier mobility and higher device speed.

Figure 7:
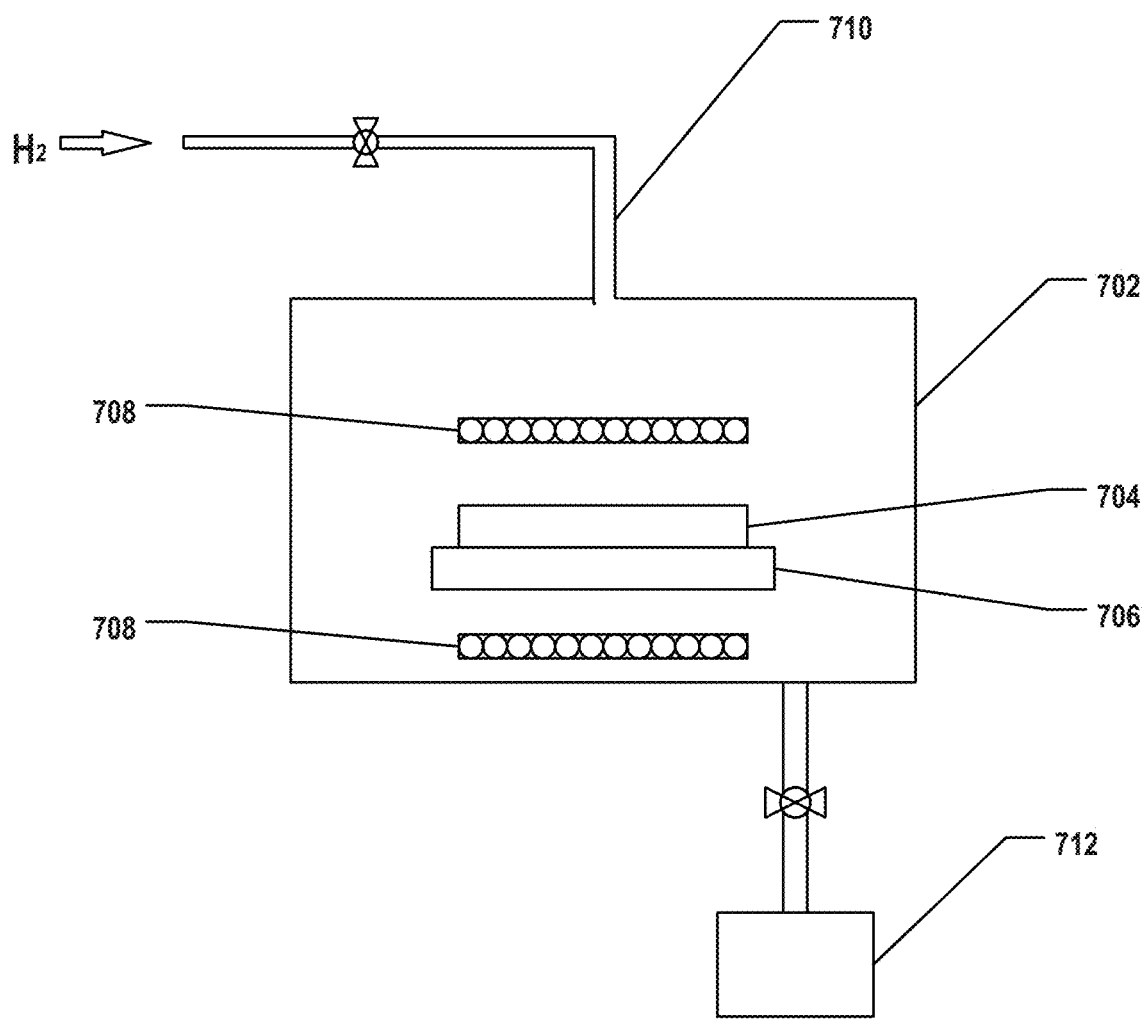
FIG. 7 illustrates an exemplary semiconductor manufacturing device, according to some aspects of the present disclosure.

FIG. 7 illustrates an exemplary semiconductor manufacturing device 700, according to some aspects of the present disclosure. Semiconductor manufacturing device 700 includes a reaction chamber 702, a substrate holder 706 located in reaction chamber 702 to hold a substrate 704, a heater 708 in reaction chamber 702 to control a process temperature, a gas source connected to reaction chamber 702 through a gasline 710, and the gas source includes at least hydrogen gas. In some implementations, reaction chamber 702 and the gas source are configured to perform a thermal treatment on substrate 704 to convert the amorphous semiconductor material to polycrystalline semiconductor material.

In some implementations, a layer of undoped amorphous silicon is formed in a memory device on substrate 704. By performing the thermal treatment by semiconductor manufacturing device 700, the layer of undoped amorphous silicon can be converted to a layer of undoped polysilicon with a grain size ranges from 100 nm to 600 nm.

In some implementations, heater 708 may control the process temperature of the thermal treatment. In some implementations, the annealing/chamber temperature may be controlled between 550 degrees Celsius to 800 degrees Celsius.

In some implementations, semiconductor manufacturing device 700 may include an evacuation unit 712 to maintain the process pressure in reaction chamber 702. In some implementations, evacuation unit 712 may be a vacuum pump including a pressure control valve. The hydrogen gas is supplied to reaction chamber 702 to react with the residuals. In some implementations, the hydrogen gas pressure may be a few milli Torrs. In some implementations, the thermal treatment includes a plurality of phases, and the time period for each phase may range from 30 minutes to a plurality of hours (e.g., 2-3 hours).

When the annealing temperatures and the hydrogen gas pressure are controlled in the chamber, the amorphous semiconductor material can undergo a nucleation process to form nuclei, and the nuclei can grow to form polysilicon. Because the nucleation and growth are conducted at respective, e.g., optimized temperatures, the crystallization can be more efficient.

It should be noted that the provided methods can also be used in other suitable scenarios, in which amorphous materials are converted to form polycrystalline materials using the provided thermal treatment, e.g., a ladder annealing process that separates the chamber conditions for nucleation and growth. Specifically, the thermal treatment can be obtained by first providing the chamber condition (e.g., temperature and time) for nucleation and then providing the chamber condition (e.g., temperature and time) for the nuclei to grow. To increase the growth rate, one or more higher growth temperatures can be used, while to improve the film quality, a lower growth temperature can be provided and a higher growth temperature can follow. The specific application of the methods of the present disclosure should not be limited by the implementations of the present disclosure.

According to one aspect of the present disclosure, a memory device includes a memory stack having interleaved a plurality of conductive layers and a plurality of insulating layers on a substrate, and a channel structure extending vertically in the memory stack. The channel structure includes a semiconductor channel extending vertically in the memory stack and conductively connected to a source structure. The semiconductor channel includes polysilicon, and a grain size of the polysilicon ranges from 100 nm to 600 nm.

In some implementations, the semiconductor channel includes an inner layer and an outer layer over the inner layer. The outer layer is further away from a center of the semiconductor channel. A first grain size of the inner layer is smaller than a second grain size of the outer layer.

In some implementations, the polysilicon includes undoped polysilicon.

In some implementations, the channel structure further includes a memory film that includes a blocking layer, a tunneling layer, and a storage layer. The blocking layer, the storage layer, the tunneling layer, and the semiconductor channel are arranged inwardly from an inner surface of the channel structure to a center of the channel structure.

In some implementations, the semiconductor channel is conductively connected to a semiconductor portion at a bottom of the channel structure, the semiconductor portion being conductively connected to the source structure.

In some implementations, the plurality of conductive layers include at least one of tungsten, cobalt, copper, aluminum, silicides, or polysilicon. In some implementations, the insulating layers include at least one of silicon oxide, silicon nitride, or silicon oxynitride.

According to another aspect of the present disclosure, a method for forming a channel structure in a memory device includes forming a stack structure having interleaved a plurality of first stack layers and a plurality of second stack layers over a substrate, forming a channel hole extending vertically in the stack structure, and depositing a semiconductor material layer over an inner surface of the channel hole. The semiconductor material layer includes an amorphous material. The method further includes converting the semiconductor material layer to a semiconductor layer. The semiconductor layer has a polycrystalline material. A conversion process includes a plurality of phases, and the phases include a first phase performed at a nucleation temperature of the amorphous material for a first period of time, and a second phase performed at a growth temperature of the polycrystalline material for a second period of time, the first and second periods of time each being greater than zero.

In some implementations, the growth temperature is higher than the nucleation temperature.

In some implementations, the first phase includes a first period performed at a first temperature lower than the nucleation temperature of the amorphous material, and a second period performed at the nucleation temperature of the amorphous material. A difference between the first temperature and the nucleation temperature is between 3% and 3.5% of the nucleation temperature.

In some implementations, the first phase includes a first period performed at the nucleation temperature of the amorphous material, and a second period performed at a second temperature higher than the nucleation temperature of the amorphous material. A difference between the second temperature and the nucleation temperature is between 3% and 3.5% of the nucleation temperature.

In some implementations, the amorphous material includes undoped amorphous silicon, and the polycrystalline material includes undoped polysilicon.

In some implementations, the growth temperature is equal to or lower than 750 degrees Celsius.

In some implementations, the undoped amorphous silicon is deposited at a temperature lower than the nucleation temperature.

In some implementations, the conversion process includes an annealing process.

In some implementations, the annealing process is performed in hydrogen gas.

In some implementations, the method further includes depositing a second semiconductor material layer over the semiconductor layer, the second semiconductor material layer including the amorphous material. The method may also include converting the second semiconductor material layer to a second semiconductor layer. The second semiconductor layer includes the polycrystalline material. A second conversion process includes a second annealing process on the semiconductor layer and the second semiconductor material layer.

In some implementations, the second annealing process includes a first phase performed at the nucleation temperature of the amorphous material for the first period of time, and a second phase performed at the growth temperature of the polycrystalline material for the second period of time. The first and second periods of time are each greater than zero.

In some implementations, the method further includes depositing a memory film between the inner surface of the channel hole and the semiconductor material layer. The memory film includes a blocking layer on the inner surface, a storage layer on the blocking layer, and a tunneling layer on the storage layer.

According to another aspect of the present disclosure, a method for forming polycrystalline layer in a semiconductor device includes depositing an amorphous material on a surface, and converting the amorphous material to a polycrystalline material. A conversion process includes a plurality of phases, and the phases include a first phase performed at a nucleation temperature of the amorphous material for a first period of time, and a second phase performed at a growth temperature of the polycrystalline material for a second period of time, the first and second periods of time each being greater than zero.

In some implementations, the growth temperature is higher than the nucleation temperature.

In some implementations, the first phase includes a first period performed at a first temperature lower than the nucleation temperature of the amorphous material, and a second period performed at the nucleation temperature of the amorphous material. A difference between the first temperature and the nucleation temperature is between 3% and 3.5% of the nucleation temperature.

In some implementations, the first phase includes a first period performed at the nucleation temperature of the amorphous material, and a second period performed at a second temperature higher than the nucleation temperature of the amorphous material. A difference between the second temperature and the nucleation temperature is between 3% and 3.5% of the nucleation temperature.

In some implementations, the amorphous material includes at least one of an amorphous semiconductor material or a metal, and the polycrystalline material includes at least one of a crystallized semiconductor material or a metal.

In some implementations, the method further includes depositing another layer of the amorphous material on the polycrystalline material, and converting the other layer of the amorphous material to another layer of the polycrystalline material. A second conversion process includes the plurality of phases. The phases include the first phase performed at the nucleation temperature of the amorphous material for the first period of time, and the second phase performed at the growth temperature of the polycrystalline material for the second period of time. The first and second periods of time are each greater than zero.

According to another aspect of the present disclosure, a semiconductor manufacturing device includes a reaction chamber, a substrate holder located in the reaction chamber to hold a substrate, and a heater in the reaction chamber to control a plurality of process temperatures. The semiconductor manufacturing device also includes a gas source connected to the reaction chamber through a gasline, and the gas source has at least hydrogen gas. The reaction chamber and the heater are configured to perform a thermal treatment on the substrate to convert an amorphous material to a polycrystalline material. The plurality of process temperatures include a first temperature at a nucleation temperature of the amorphous material and a second temperature at a growth temperature of the polycrystalline material.

In some implementations, the growth temperature is higher than the nucleation temperature.

In some implementations, the plurality of process temperatures range from 560 degrees Celsius to 800 degrees Celsius.

In some implementations, the heater is configured to maintain the plurality of process temperatures each for a respective period of time.

The foregoing description of the specific implementations can be readily modified and/or adapted for various applications. Therefore, such adaptations and modifications are intended to be within the meaning and range of equivalents of the disclosed implementations, based on the teaching and guidance presented herein.

The breadth and scope of the present disclosure should not be limited by any of the above-described exemplary implementations, but should be defined only in accordance with the following claims and their equivalents.

What is claimed is:

1. A method for forming a channel structure in a memory device, comprising:
    forming a stack structure comprising interleaved a plurality of first stack layers and a plurality of second stack layers over a substrate;
    forming a channel hole extending vertically in the stack structure;
    depositing a semiconductor material layer over an inner surface of the channel hole, the semiconductor material layer comprising an amorphous material; and
    converting the semiconductor material layer to a semiconductor layer, the semiconductor layer comprising a polycrystalline material, wherein a conversion process comprises a plurality of phases, and the phases comprise:
- a first phase performed at a first nucleation temperature of the amorphous material for a first period of time,
- a second phase performed at a growth temperature of the polycrystalline material for a second period of time, the first and second periods of time each being greater than zero, the growth temperature being higher than the first nucleation temperature, and
- a third phase before the first phase and performed at a second nucleation temperature lower than the first nucleation temperature.

2. The method of claim 1, wherein:
the growth temperature is higher than the first nucleation temperature and the second nucleation temperature; and
the first nucleation temperature and the second nucleation temperature are included in a range of 580 degrees Celsius and 600 degrees Celsius.

3. The method of claim 1, wherein a difference between the first nucleation temperature and the second nucleation temperature being between 3% and 3.5% of the first nucleation temperature.

4. The method of claim 1, wherein the third phase performed at the second nucleation temperature lower than the growth temperature of the polycrystalline material, a difference between the second nucleation temperature and the first nucleation temperature being between 3% and 3.5% of the first nucleation temperature.

5. The method of claim 1, wherein the amorphous material comprises undoped amorphous silicon, and the polycrystalline material comprises undoped polysilicon.

6. The method of claim 5, wherein the growth temperature is equal to or lower than 750 degrees Celsius.

7. The method of claim 5, wherein the undoped amorphous silicon is deposited at a temperature lower than the first nucleation temperature.

8. The method of claim 1, wherein the conversion process comprises an annealing process.

9. The method of claim 8, wherein the annealing process is performed in hydrogen gas.

10. The method of claim 1, further comprising:
depositing a second semiconductor material layer over the semiconductor layer, the second semiconductor material layer comprising the amorphous material; and
converting the second semiconductor material layer to a second semiconductor layer, the second semiconductor layer comprising the polycrystalline material, wherein a second conversion process comprises a second annealing process on the semiconductor layer and the second semiconductor material layer.

11. The method of claim 10, wherein the second annealing process comprises:
- a first phase performed at the first nucleation temperature of the amorphous material for the first period of time, and
- a second phase performed at the growth temperature of the polycrystalline material for the second period of time, the first and second periods of time each being greater than zero.

12. The method of claim 1, further comprising depositing a memory film between the inner surface of the channel hole and the semiconductor material layer, wherein the memory film comprises a blocking layer on the inner surface, a storage layer on the blocking layer, and a tunneling layer on the storage layer.

13. The method of claim 1, wherein the second nucleation temperature is between 580 degrees Celsius and 600 degrees Celsius.

14. The method of claim 13, wherein the first nucleation temperature is approximately 600 degrees Celsius.

15. The method of claim 1, wherein the growth temperature is between 600 degrees Celsius and 750 degrees Celsius.

16. The method of claim 1, wherein:
the growth temperature is a first growth temperature; and
the phases comprise a fourth phase after the second phase and performed at a second growth temperature, the second growth temperature being higher than the first growth temperature.

17. The method of claim 16, wherein the second growth temperature is between 650 degrees Celsius and 750 degrees Celsius.

18. A method for forming a channel structure in a memory device, comprising:
forming a stack structure comprising interleaved a plurality of first stack layers and a plurality of second stack layers;
forming a channel hole extending through the stack structure;
depositing a semiconductor material layer over sidewalls of the channel hole, the semiconductor material layer comprising an amorphous material; and
converting the semiconductor material layer to a semiconductor layer in a conversion process, the semiconductor layer comprising a polycrystalline material, wherein:
the conversion process comprises a plurality of phases;
the phases comprise a first nucleation phase, a second nucleation phase, and a plurality of growth phases performed in this order; and
temperatures at which the first nucleation phase, the second nucleation phase, and the plurality of growth phases are performed sequentially increase.

19. The method of claim 18, wherein:
the first nucleation phase is performed at a first nucleation temperature;
the second nucleation phase is performed at a second nucleation temperature; and
a difference between the second nucleation temperature and the first nucleation temperature being between 3% and 3.5% of the second nucleation temperature.

20. The method of claim 19, wherein:
the plurality of growth phases comprise a first growth phase performed at a first growth temperature and a second growth phase performed at a second growth temperature; and
the first growth temperature is between 600 degrees Celsius and 750 degrees Celsius.

* * * * *